United States Patent [19]

Kim et al.

[11] Patent Number: 5,821,034

[45] Date of Patent: Oct. 13, 1998

[54] METHOD FOR FORMING MICRO PATTERNS OF SEMICONDUCTOR DEVICES

[75] Inventors: Hyeong Soo Kim; Chang Mun Lim; Ki Ho Baik, all of Ichon-shi, Rep. of Korea

[73] Assignee: Hyundai Electronics Industries, Co., Ltd., Ichon-shi, Rep. of Korea

[21] Appl. No.: 720,020

[22] Filed: Sep. 27, 1996

[30] Foreign Application Priority Data

Sep. 29, 1995 [KR] Rep. of Korea ................... 95-32739

[51] Int. Cl.$^6$ ....................................... G03F 7/20
[52] U.S. Cl. .................. 430/311; 430/394; 250/492.2
[58] Field of Search ................. 430/311, 1, 394; 250/492.1, 492.2, 492.22; 359/11

[56] References Cited

U.S. PATENT DOCUMENTS 4,859,548   8/1989   Heise ........................................... 430/1

*Primary Examiner*—Kathleen Duda
*Attorney, Agent, or Firm*—Thelen, Reid & Priest LLP

[57] ABSTRACT

A method for forming micro patterns of a semiconductor device which uses a dipole illumination aperture adapted to transmit the spatial frequency components of light only in the X-axis direction and a dipole illumination aperture adapted to transmit the spatial frequency components of light only in the Y-axis direction, thereby obtaining the same effect as in the case using two sheets of masks to provide an increase in process margin.

4 Claims, 7 Drawing Sheets

METHOD FOR FORMING MICRO PATTERNS OF SEMICONDUCTOR DEVICES

BACKGROUND OF THE INVENTION

1. Field of the Invention

The present invention relates to a method for forming micro patterns of a semiconductor device, and more particularly to a method for forming micro patterns of a semiconductor device which involves a primary light exposure using a dipole illumination aperture adapted to condense only the horizontal spatial frequency components of light onto a projection lens and a secondary light exposure using a dipole illumination apertured adapted to condense only the vertical spatial frequency components of light onto the projection lens.

2. Description of the Prior Art

Patterning techniques for forming patterns having different horizontal and vertical lengths are known. Conventional patterning techniques include those using a single mask as shown in FIG. 1A and those using a pair of masks as shown in FIGS. 2A and 2B.

FIG. 1A is a view showing a mask used to form patterns for charge storage electrodes in accordance with a convention pattern formation method. On the other hand, FIG. 1B is a view showing patterns formed using the mask of FIG. 1.

As shown in FIG. 1A, the mask, which is denoted by the reference numeral 1, is provided with a plurality of rectangular mask patterns 2 arranged in a matrix array. The mask 1 is used to pattern a photoresist film formed on a semiconductor substrate. Referring to FIG. 1B, it can be found that photoresist film patterns obtained after patterning the photoresist film using the mask 1 have a round shape which varies from the rectangular shape of the mask patterns. This is because a light interference phenomenon occurs in the patterning procedure due to a proximity effect, etc..

such variation in the scope of the patterns becomes more severe as the interval of those patterns becomes smaller.

Moreover, a defocus phenomenon may also occur where the mask has process defects generated upon the fabrication thereof or a reduced process margin. In this case, bridges 5 connecting adjacent photoresist film patterns 3 may be formed, as shown in FIG. 1B.

For patterns for charge storage electrodes, it is difficult to obtain a sufficient process margin because those patterns should have a very small pattern area and interval. In order to solve this problem, a double light exposure method has been proposed. In accordance with this double light exposure method, light exposure is conducted using two sheets of masks, that is, the mask having spatial frequencies only in the lateral (X-axis) direction and the mask having spatial frequencies only in the longitudinal (Y-axis) direction. However, the double light exposure method is problematic in that a degradation in overlay accuracy occurs. For this reason, the double light exposure method has had limited use.

The double light exposure method will now be described in more detail.

FIG. 2A illustrates a mask having spatial frequencies only in the X-axis direction. On the other hand, FIG. 2B illustrates a mask having spatial frequencies only in the Y-axis direction.

In accordance with the double light exposure method, a primary patterning is first conducted using the mask 6 of FIG. 2A which has spatial frequencies only in the X-axis (horizontal) direction. By the primary patterning, preliminary photoresist film patterns 8 are obtained as shown in FIG. 2C. Thereafter, a secondary patterning is conducted using the mask 7 of FIG. 2B which has spatial frequencies only in the Y-axis (vertical) direction. By the secondary patterning, final photoresist film patterns 3' for charge storage electrodes are obtained as shown in FIG. 2D.

Although this double light exposure method can obtain patterns having a desired shape as compared to the case of FIG. 1A, it involves an increase in manufacturing cost because two masks should be used. The use of two masks also causes difficulty in maintaining a desired overlay accuracy. As a result, a degradation in yield occurs.

However, if the X and Y-axis light exposure processes can be independently carried out even in the case using a single mask as shown in FIG. 1, then the same effect as in the case using two masks may be obtained.

SUMMARY OF THE INVENTION

Therefore, a method for forming micro patterns of a semiconductor device which uses a dipole illumination aperture adapted to transmit the spatial frequency components of light only in the X-axis direction and a dipole illumination aperture adapted to transmit the spatial frequency components of light only in the Y-axis direction, thereby obtaining the same effect as in the case using two sheets of masks to provide an increase in process margin.

In accordance with the present invention, this object is accomplished through a method for forming micro patterns of a semiconductor device having both the spatial frequencies of horizontal and vertical axes, comprising the steps of: conducting a primary light exposure using a dipole illumination aperture adapted to condense only the horizontal spatial frequency components of light; and conducting a secondary light exposure using another dipole illumination aperture adapted to condense only the vertical spatial frequency components of light, thereby forming micro patterns.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 3A:
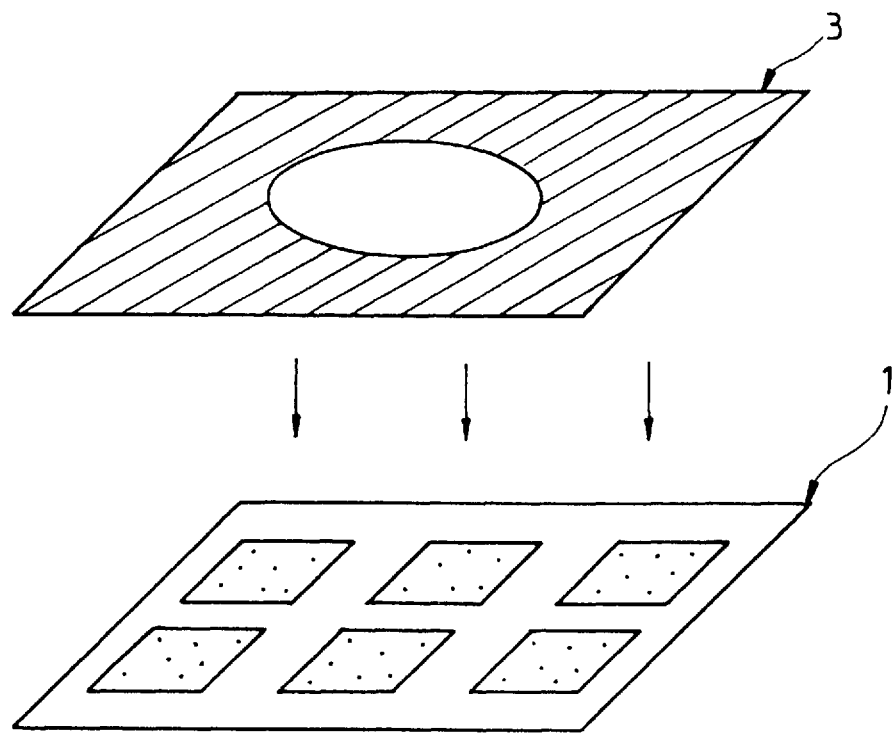
FIG. 3A is a schematic view illustrating a general light exposure device.
Figure 3A:
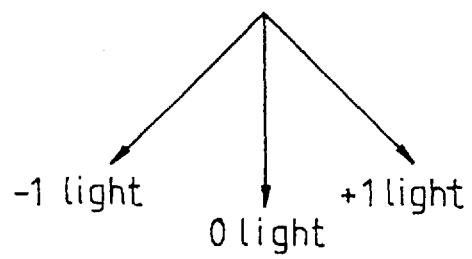
Figure 3A:

FIG. 3A is a schematic view illustrating a general light exposure device.

Figure 1A:
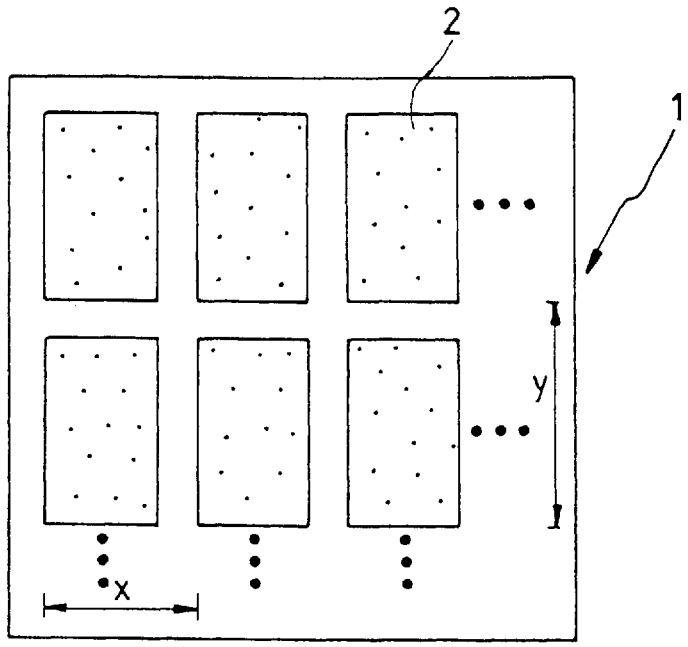
FIG. 1A is a view showing a mask used to form patterns for charge storage electrodes in accordance with a convention pattern formation method.
Figure 1B:
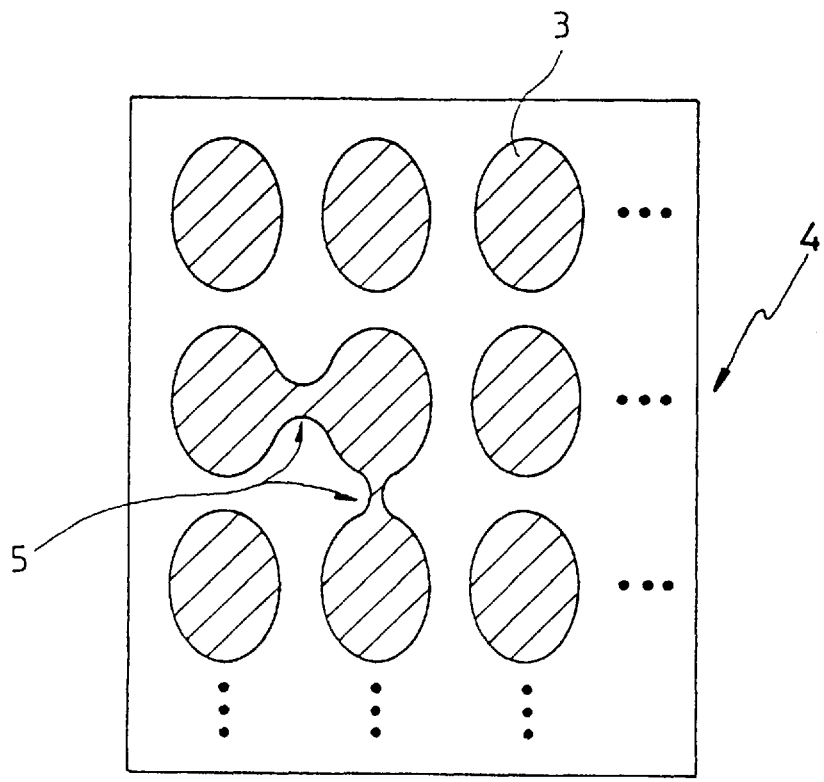
FIG. 1B is a view showing patterns formed using the mask of FIG. 1.

When light exposure is carried out using the mask 1 of FIG. 1A to form patterns for charge storage electrodes, 0th, =1's and −1'st diffracted light beams are concentrated onto a projection lens 10, as shown in FIG. 3A.

Figure 3B:
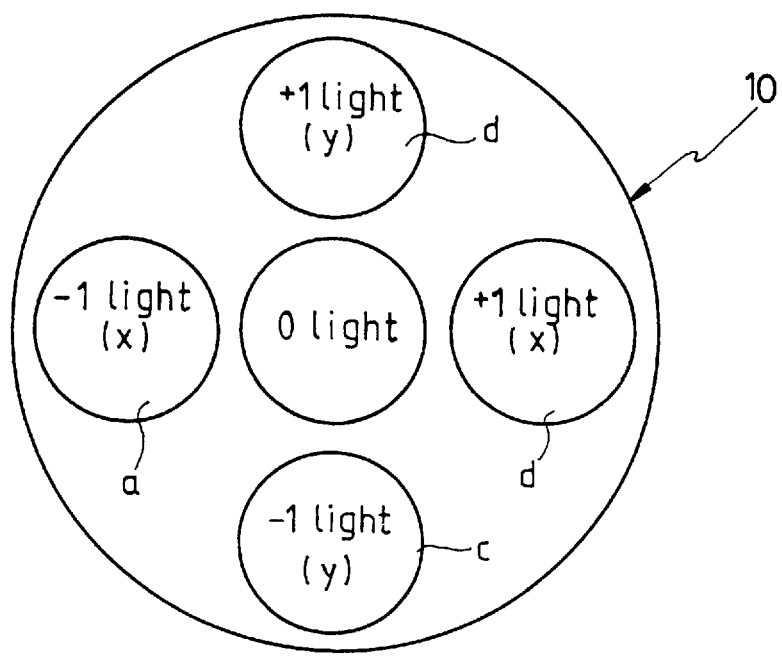
FIG. 3B is a diagram illustrating a distribution of diffracted light concentrated on a projection lens when light exposure is conducted using the mask of FIG. 1A and the conventional aperture.
Figure 3C:
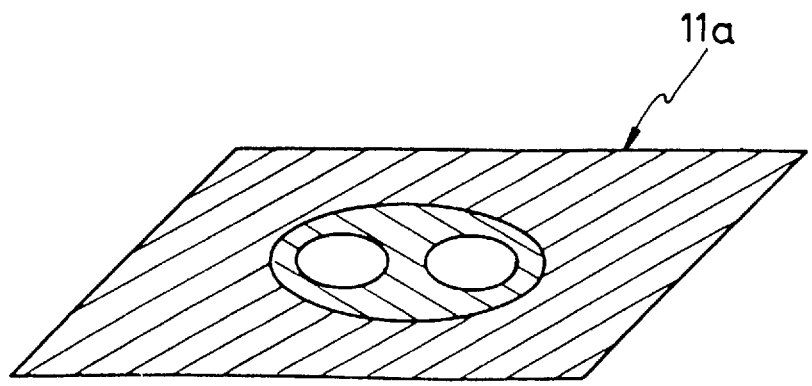
FIG. 3C is a perspective view of a dipole illumination aperture which reflects only the horizontal spatial frequencies.

When looking at the projection lens 10 from above, a distribution of diffracted light beams as shown in FIG. 3B is viewed. The ±1'st light beam patterns x (a and b) are diffracted light patterns for spatial frequencies in the X-axis direction whereas the ±1'st light beam patterns y (c and d) are diffracted light patterns for spatial frequencies in the Y-axis direction.

Figure 3D:
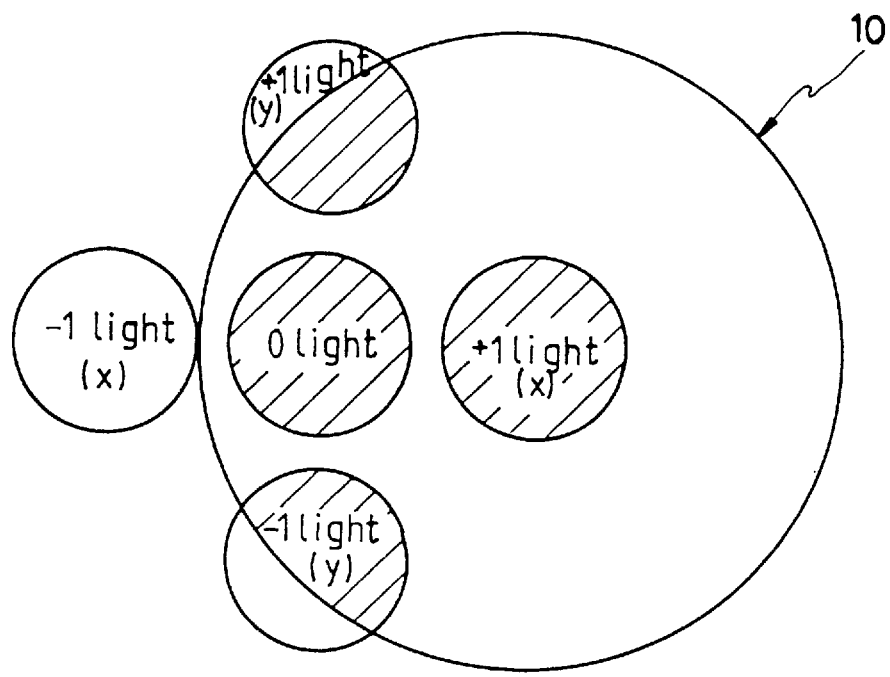
FIG. 3D is a diagram illustrating a distribution of diffracted light concentrated on a projection lens when light exposure is conducted using the mask of FIG. 1A and the dipole illumination aperture of FIG. 3C.

The wavelength band of light used in the light exposure process ranges from 50 nm to 800 nm. The mask used for the light exposure process may be a conventional mask or phase shift mask.

Where a dipole illumination aperture 11a of FIG. 3A designed to reflect only the X-axis spatial frequency components of light is used instead of the conventional aperture 9 shown in FIG. 3, a distribution of diffracted light as shown in FIG. 3D is obtained on the projection lens 10.

In the case of FIG. 3D, the Y-axis spatial frequencies components of light are condensed on the pupil of the projection lens. Accordingly, the light condensation is not conducted or hardly conducted.

Figure 2A:
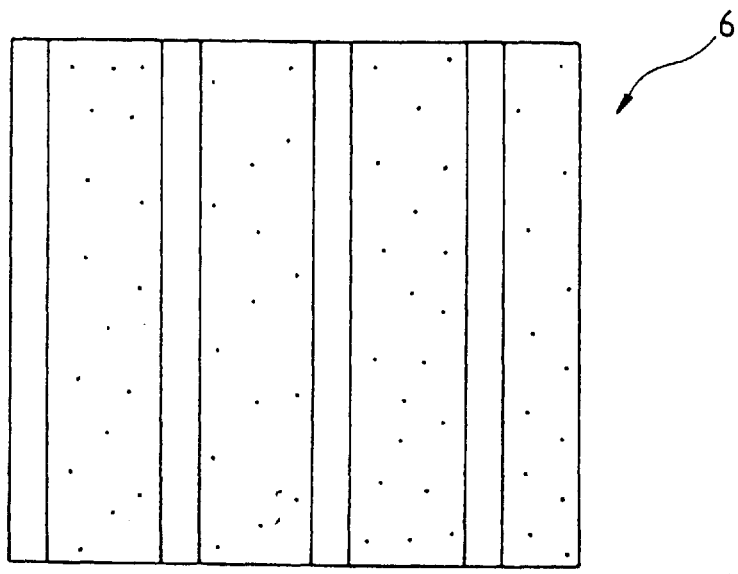
FIG. 2A is a view showing a mask having spatial frequencies only in the X-axis direction.

In other words, it is possible to obtain patterns similar to those obtained when the mask 6 of FIG. 2A is exposed to light using the conventional aperture 9.

Figure 3E:
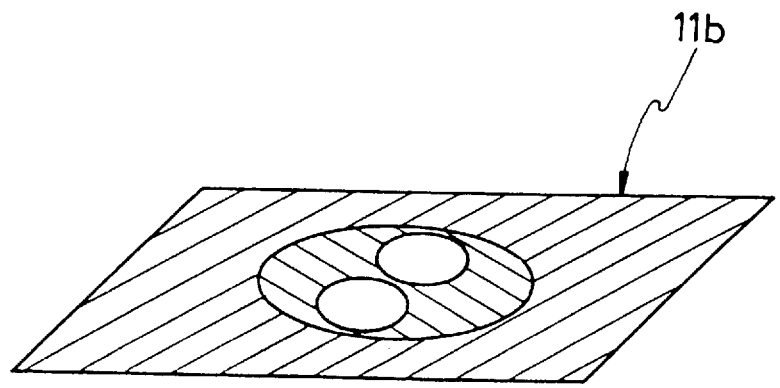
FIG. 3E is a perspective view of a dipole illumination aperture which reflects only the vertical spatial frequencies.

Thereafter, light exposure is carried out using a dipole illumination aperture 11b of FIG. 3E designed to reflect only the Y-axis spatial frequency components of light. In this case, a distribution of diffracted light as shown in FIG. 3F is obtained.

The dipole illumination apertures 11a and 11b has a distance between poles larger than 0, but equal to or smaller than the value of "aperture diameter—2×pole diameter".

Figure 2B:
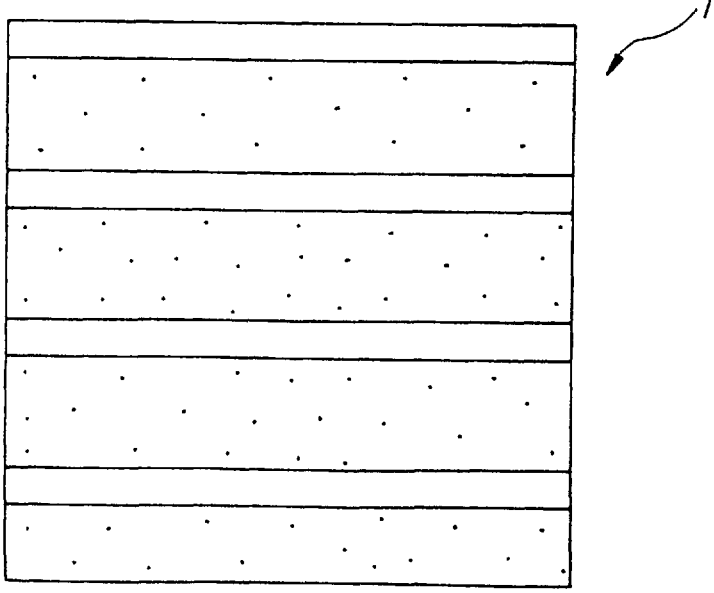
FIG. 2B is a view showing a mask having spatial frequencies only in the Y-axis direction.
Figure 2C:
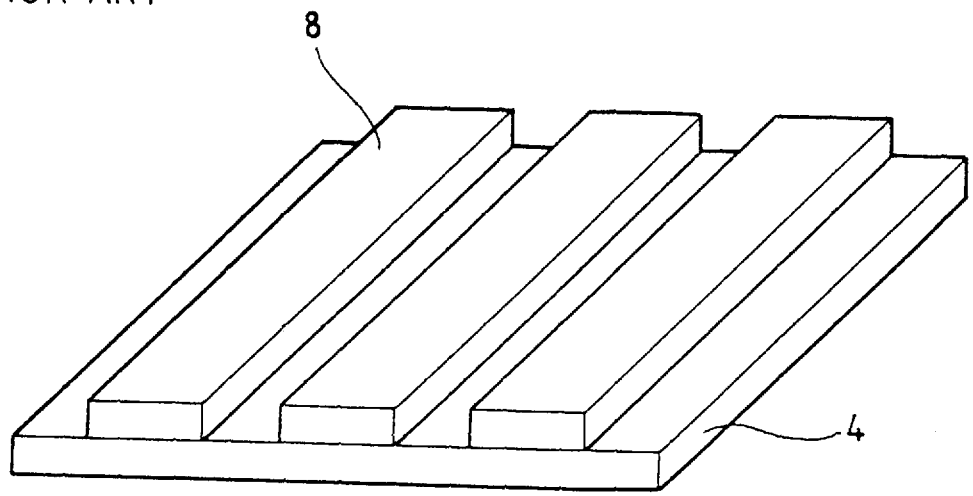
FIG. 2C is a view showing patterns formed using the mask of FIG. 2A.
Figure 2D:
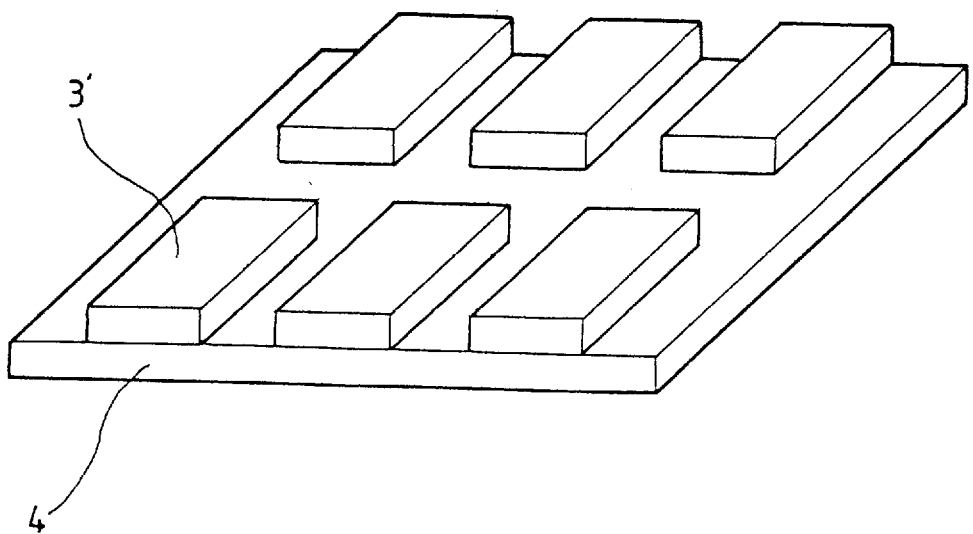
FIG. 2D is a view showing patterns formed using the mask of FIG. 2B.
Figure 3F:
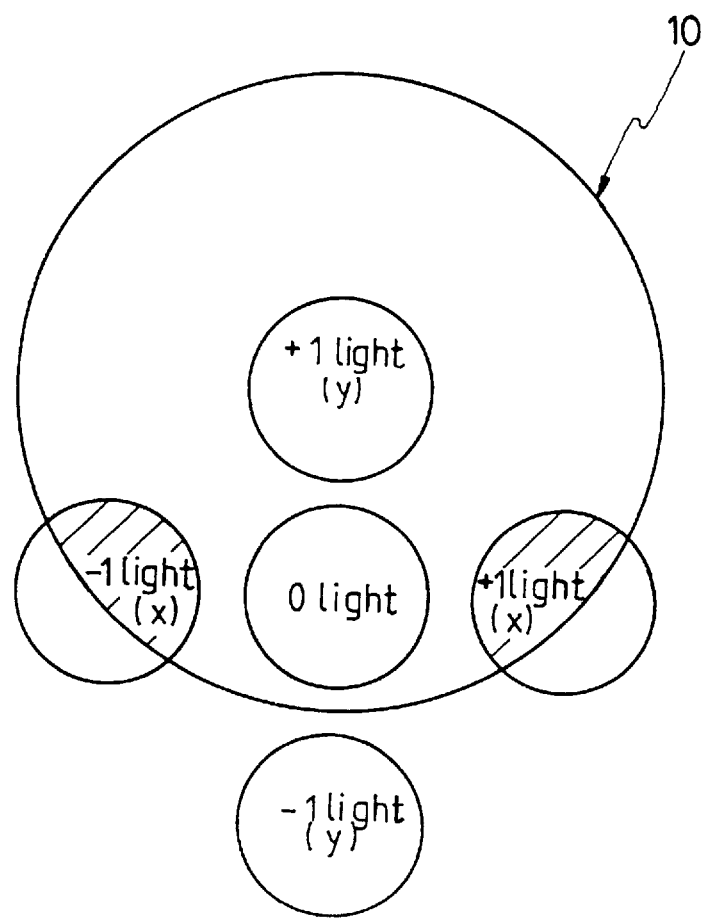
FIG. 3F is a diagram illustrating a distribution of diffracted light condensed onto the projection lens when light exposure is conducted using the mask of FIG. 1A and the dipole illumination aperture of FIG. 3E.

FIG. 3F shows a distribution of diffracted light condensed onto the projection lens when light exposure is conducted using the dipole illumination aperture of FIG. 3E and the mask of FIG. 1A. In this case, it is possible to obtain the same pattern as in the case in which the mask of FIG. 2B is exposed to light using the conventional aperture 9.

In the cases of FIGS. 3D and 3F, a resolution and focus redundancy higher than those in the case using the conventional aperture by two times is obtained because an oblique illumination is used. Accordingly, it is possible to obtain patterns having a large process margin when the method of the present invention involving a double light exposure conducted by two apertures is used.

Although the double light exposure is carried out, it requires two sheets of masks. For the double light exposure, only two apertures are needed. Accordingly, it is possible to reduce the manufacturing cost of the mask. Advantageously, only one measurement of the overlay accuracy between the masks is required.

Although light exposure is carried out using the conventional aperture, it is possible to obtain desired patterns having both the spatial frequencies of horizontal and vertical axes. In this case, however, it is necessary to use an optical filter arranged on the projection lens. When diffracted light based on the horizontal spatial frequencies and diffracted light based on the vertical spatial frequencies are simultaneously incident on the projection lens, the optical filter serves to transmit the diffracted light onto an image plane only in one axis direction.

As is apparent from the above description, the present invention provides a method for forming micro patterns of a semiconductor device which uses a dipole illumination aperture adapted to transmit the spatial frequency components of light only in the X-axis direction a dipole illumination aperture adapted to transmit the spatial frequency components of light only in the Y-axis direction, thereby obtaining the same effect as in the case using two sheets of masks. Accordingly, it is possible to provide an increase in process margin.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming micro patterns of a semiconductor device having spatial frequencies of both horizontal and vertical axes, the method comprising:

conducting a primary light exposure using a dipole illumination aperture adapted to condense only horizontal spatial frequency components of light; and conducting a secondary light exposure using a second dipole illumination aperture adapted to condense only vertical spatial frequency components of light, thereby forming the micro patterns;

wherein each of the first and second dipole illumination apertures has a distance between poles thereof that varies in accordance with the spatial frequency of the patterns to be obtained.

2. The method in accordance with claim 1, wherein:

the light used in the light exposure has a wavelength band ranging from 50 nm to 800 nm.

3. The method in accordance with claim 1, wherein:

the light exposure uses a conventional mask or a phase shift mask.

4. The method in accordance with claim 1, wherein:

the distance between poles is larger than 0, but equal to or smaller than the value of "aperture diameter—2×pole diameter."

* * * * *